United States Patent [19]
Grabbe et al.

[11] Patent Number: 5,575,661
[45] Date of Patent: Nov. 19, 1996

[54] FLEXIBLE FILM WITH CIRCUITRY THEREON HAVING IMPROVED LOCAL COMPLIANCE AND FORCE DISTRIBUTION

[75] Inventors: Dimitry G. Grabbe, Middletown; George R. Schmedding, Hummelstown; David B. Wrisley, Jr., Harrisburg, all of Pa.

[73] Assignee: The Whitaker Corporation, Wilmington, Del.

[21] Appl. No.: 299,221

[22] Filed: Aug. 31, 1994

[51] Int. Cl.$^6$ .................................................. H01R 9/09
[52] U.S. Cl. .................................................. 439/62; 439/67
[58] Field of Search .................................. 439/62, 67, 493, 439/632, 77, 492, 499, 801

[56] References Cited

U.S. PATENT DOCUMENTS

| | | | |
|---|---|---|---|
| 4,969,824 | 11/1990 | Casciotti | 439/62 |
| 5,007,842 | 4/1991 | Denk et al. | 439/77 |
| 5,171,154 | 12/1992 | Casciotti et al. | 439/67 |

*Primary Examiner*—Neil Abrams
*Assistant Examiner*—Barry Matthew L. Standig

[57] ABSTRACT

The invention relates to an improved, high density electrical connector, such as a backplane connector, which utilizes a flexible film having circuitry thereon for interconnecting plural planar electronic devices, such as a daughter board to a mother board. The improvement is derived through the use of a flexible film enhanced for local compliance, and to the inclusion of a force distribution member. The enhanced flexible film comprises a composite of a thin, flexible, dielectric film having upper and lower surfaces, a thin layer of metal disposed along the lower surface, and a plurality of discrete metallic pads or traces along the upper surface. Improved local compliance is accomplished by the thin metal layer having plural through slots, by mechanical punching or laser cutting, where each slot is aligned between a pair of adjacent metallic pads or traces. By this arrangement, the composite has improved local compliance between adjacent metallic pads or traces. To further improve the electrical connection of this enhanced flexible film, a force distribution member, underlying and in contact with the flexible film is provided. The force distribution member comprises an elastomeric member adjacent a first surface of the flexible film composite, and a thin metal force integrator along a surface of the elastomeric member remote from the composite. The force distribution member, in turn, is urged against the flexible film composite by a coil spring, for example, as known in the art.

13 Claims, 5 Drawing Sheets

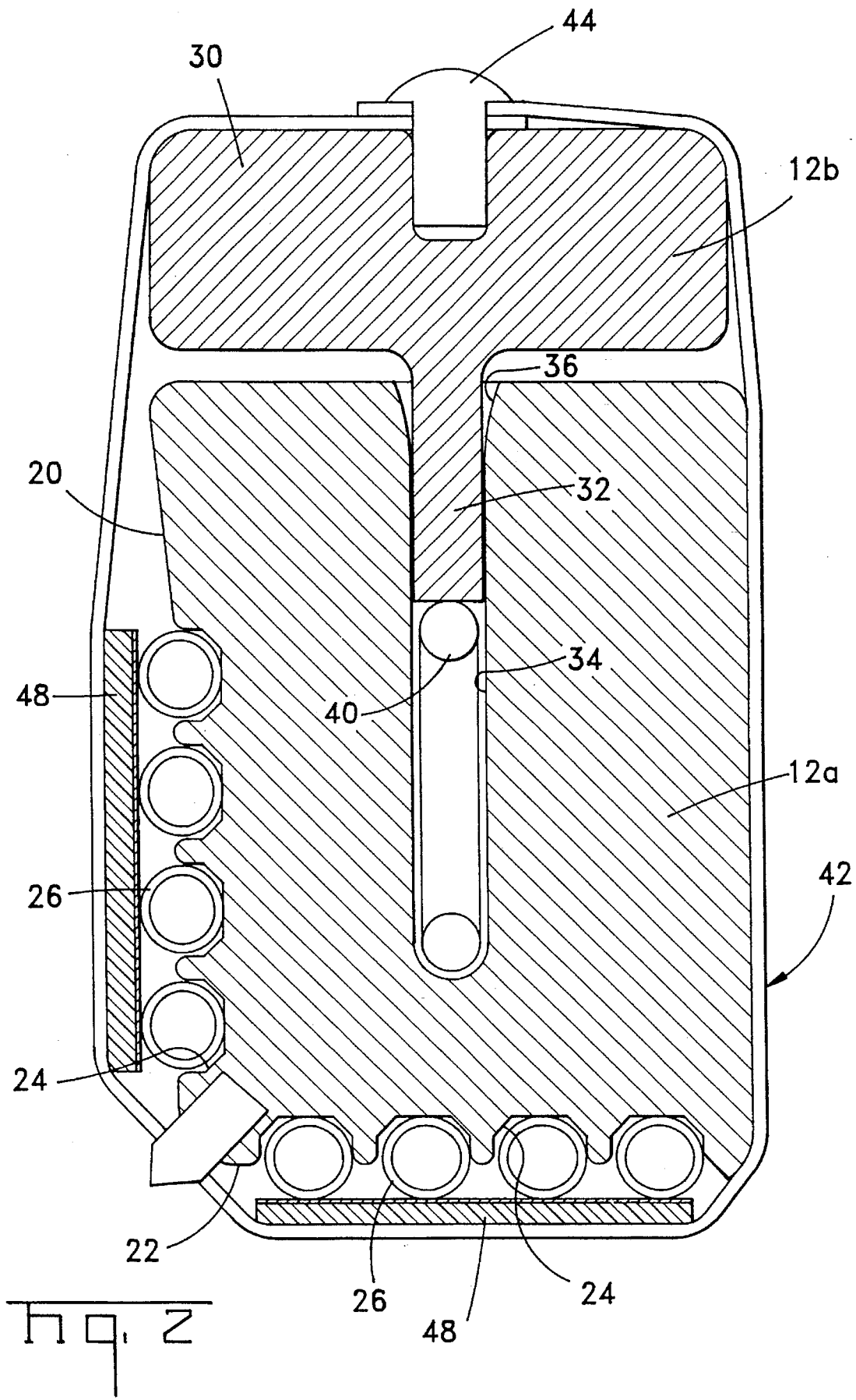

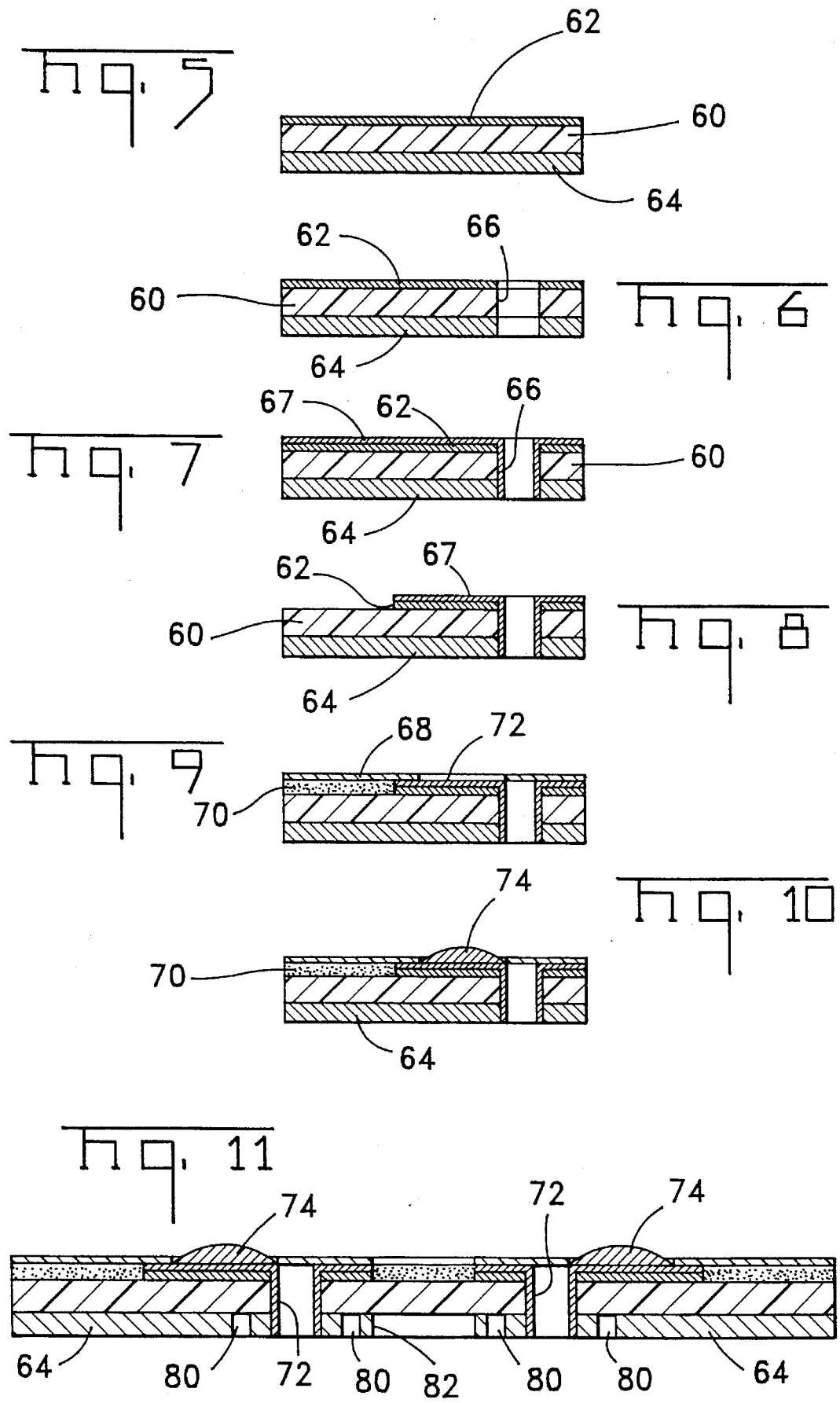

FLEXIBLE FILM WITH CIRCUITRY THEREON HAVING IMPROVED LOCAL COMPLIANCE AND FORCE DISTRIBUTION

BACKGROUND OF THE INVENTION

This invention is directed to an improved locally compliant flexible circuit film for use as the electrical interconnection system in a high density, backplane connector of the type taught in U.S. Pat. Nos. 4,969,824 and 5,171,154, incorporated herein by reference, and assigned to the assignee hereof. A modified connector for which this improved flexible film may be employed is described in co-pending application, Ser. No. (08/299,222), which application is incorporated by reference. In each case, the prior art generally describes a pair of one-piece connector housing members, arranged for mounting to a first planar electronic device, such as a mother board, where such housing members are spaced apart to define a slot for receiving a second planar electronic device, such as a daughter board, to be electrically interconnected to said mother board by way of a flexible film circuit. In a commercial embodiment of the invention, the respective housing faces, adjacent the planar electronic devices, include channels for receiving a coiled spring, and a flexible film, having electrical circuitry or traces thereon, wrapped about the housing members and coiled springs. The coiled springs provide a normal force to the film to ensure electrical contact with the respective planar electronic devices.

Experience has shown that connectors of this type may exhibit some difficulties with longevity in terms of the number of insertions by the daughter board, as well as reliability of making good electrical connections. One of such difficulties is associated with the nature of the flexible film, and the copper circuitry thereon, the subject of this invention. Briefly, due to the electrical requirements and a need to control the characteristic impedance, for the flexible film a minimum of two metallic layers are required, separated by a dielectric of correct thickness to produce the desired effect by the structure. As evidenced with the teachings of the above mentioned patents, the intent was to use the desirable properties of the canted coil spring, which offers a shallow force deflection curve, as the means of producing the normal force between the planar electronic device and the flexible film connector. However, due to the combination of copper and dielectric layers thicknesses, local compliance between two adjacent pads in the direction normal to the flexed surface, may be insufficient to compensate for even relatively small differences in height or otherwise induced variation of the combination of a printed circuit and the flex coplanarity. The practice has shown that even a small particle, such as a couple of microns in size, between a pair of pads or traces will affect the adjacent pads or traces adversely. This is particularly true in high density connectors where centerline spacings are on the order of 0.05 mils. The local stiffness has been demonstrated such, that a deflection of the pad adjacent to the offending one required a local force of 400 grams to deflect the flex pad 0.0002". Since the canted coil spring applies a pressure to the back of the flex circuit at points incrementally spaced according to the spring winding pitch, and frequently not coincident with the pad center, neither the force available nor the force application points are optimum to deflect a pad which is out of contact due to the surface imperfection in its vicinity. Recognition of these problems, and the solutions offered by this invention, pin pointed two areas of concern, namely, more uniform distribution of force over the area of the circuit pads or traces, and a means for making adjacent pads or traces more compliant to adjust for local coplanarity mismatch.

While the co-pending application addresses the design and construction of the connector by the use of a two-piece, floating housing that ensures a predetermined tension on the flexible circuit film. However, such a unique housing construction does not answer all the concerns with the prior art, particularly as to force distribution and local compliance.

The present invention relates to the latter concerns by the use of a steel backed elastomer, between the coil springs and flexible film, to produce a more uniform force distribution, and to the imposition or creation of slots or slits at least partially through the flexible film, typically a composite of at least two metallic layers with a plastic intermatable layer, in order to allow adjacent pads to move either independently or compliantly to each other, by virtue of local displacement induced by the underlying elastomer. These and other features of this invention will become apparent to those skilled in the art from a reading of the following specification, particularly in view of the accompanying drawings.

SUMMARY OF THE INVENTION

This invention relates to an improved, high density, back plane connector of the type which utilized a flexible film having circuitry thereon for interconnecting a pair of planar electronic devices, such as a mother board and a daughter board. The improvement is derived from the use of a modified flexible film, supported by a force applying member, such as plural coiled springs, which provides local compliance between adjacent contact pads or traces, and by the use of a force integrator that better distributes the normal force applied to the flexible film. The flexible film, typically provided with a metallic grounding layer, such as copper, on a surface opposite the contact pads or traces, is modified by the inclusion of discrete slots in the copper layer, where the slots are aligned between adjacent contact pads or traces. This results in an improved compliance between such adjacent contact pads or traces. Additionally, improved force distribution is achieved by a force integrator consisting of a thin metal shim or sheet having an elastomeric layer, where the force integrator is interposed between the flexible film and the force applying means.

BRIEF DESCRIPTION OF DRAWINGS

FIG. 2 is an enlarged sectional view of one of the pairs of connector housings illustrated in FIG. 1.

FIG. 3 is a partial, enlarged sectional view taken through the mating face of the connector housing, illustrating the modified flexible film and circuitry thereof with a force distribution member interposed between said flexible film and a force applying member.

FIGS. 5 to 11 are partial sectional views illustrating the sequence of manufacturing steps to produce the modified flexible film according to one aspect of this invention.

DETAILED DESCRIPTION OF PREFERRED EMBODIMENT

The present invention is directed to a locally complaint flexible circuit film, preferable including a force distribution system, as the electrical interconnection means in a high density electrical connector of the type for mounting a first planar electronic device, such as a daughter board, to a second planar electronic device, such as a mother board, where the respective devices are electrically interconnected through the flexible film associated with a connector typically secured to one of said devices. The general arrangement of this type of connector, also known as a card edge or backplane connector, is illustrated in U.S. Pat. Nos. 4,969,824 and 5,171,154, while an improved connector is described in said co-pending application.

Figure 1:
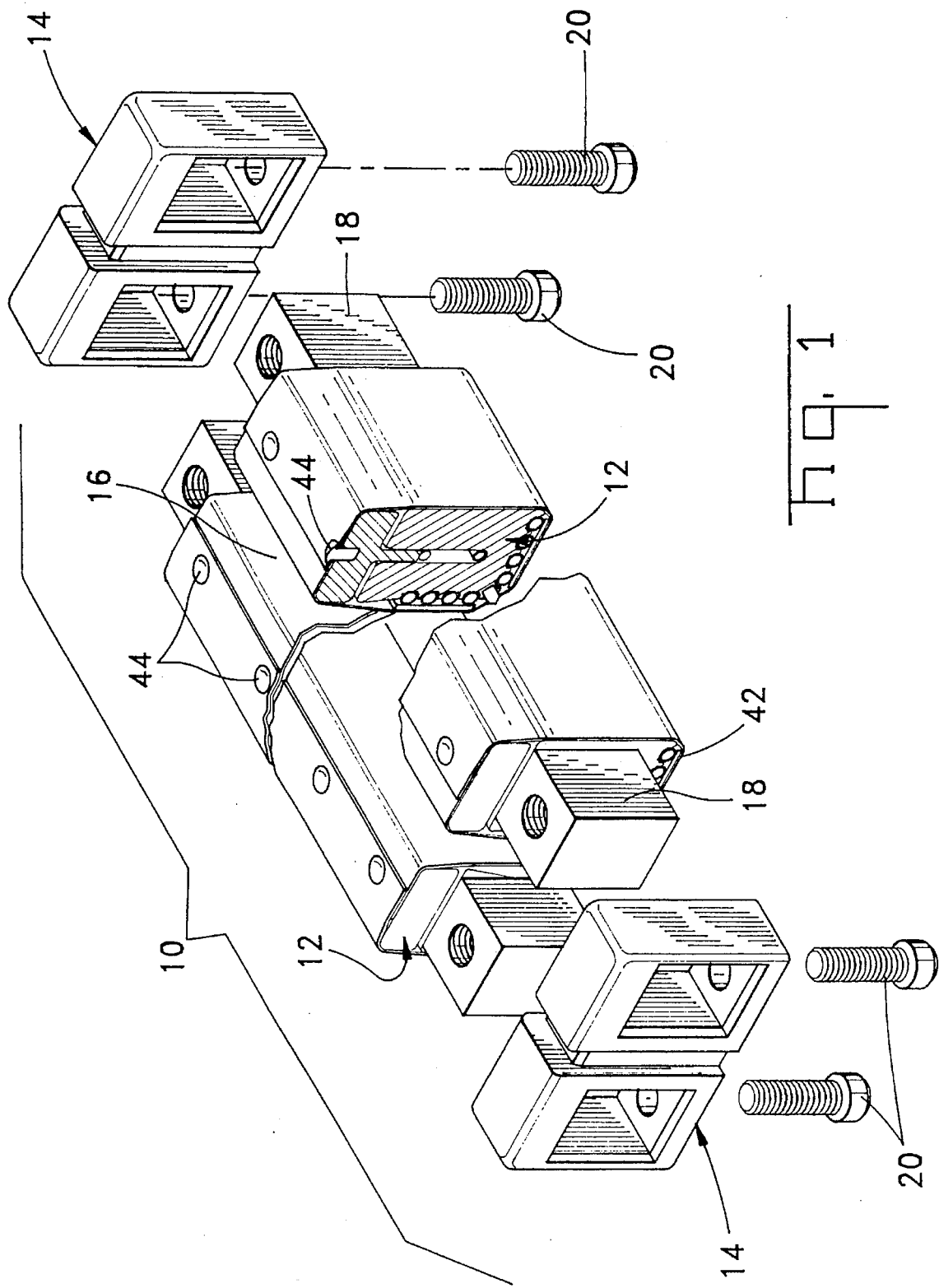
FIG. 1 is an exploded perspective view of a high density connector suitable for use in incorporating the features of this invention, where the construction of said connector is the subject of said co-pending application.

FIGS. 1 and 2 illustrate, in an exploded fashion and section, respectively, a high density electrical connector 10 utilizing the teachings of this invention. For a more detailed review of this connector design and construction, reference may again be made to said co-pending application. In any case, the connector of FIG. 1 includes a pair of connector housing members 12, typically elongated, which are essentially identical in configuration. The two housing members 12 may be joined by end blocks 14 to form a unitary member having a longitudinal slot 16 between the respective housing members. Though not illustrated, the slot 16 is intended to receive the first planar electronic device, or daughter board, in the manner of the prior art described above.

The assembled connector, that is, with the end blocks 14 positioned over the housing extensions 18, may be secured to a second planar electronic device, such as a mother board (not illustrated), by threaded fasteners 20. Such a manner of mounting or securing is well known in the art.

While FIG. 2 represents the preferred construction of a two-piece, floating housing, and the subject of the co-pending application, it will be understood that the contributions of this invention are applicable to the one-piece housings of the above noted prior art. Nevertheless, continuing with the construction of the two-piece housing of FIG. 2, each housing member 12 comprises first and second members, 12a and 12b respectively, where the second or upper member 12b is floatably mounted to said first or lower member 12a. The housing members may be made of extruded aluminum or a molded plastic, as known in the art. Each first member, along a slot face 20 and base face 22 is provided with one or plural grooves 24 which typically extend the length of the connector 10, i.e. between end blocks 14. Within said grooves, a canted coil spring 26 is provided. Canted coil springs are preferred and are made and sold by the Bal Seal Engineering Company Inc. of Santa Ana, Calif. These springs have a high degree of deflection with the force remaining nearly constant over the working range of deflection due to being canted. For a further understanding thereof, reference is made to U.S. Pat. No. 4,969,824.

The second or upper member 12b, as illustrated in FIGS. 2 and 3, may comprise a T-configured member having an upper portion 30 and a lower extension 32 projecting essentially perpendicular thereto. The extension is centrally positioned and arranged to be received in sliding engagement with slot 34 in the first or lower member 12a. It will be noted that the slot opening 36 has been flared outwardly to allow a certain degree of rocking or lateral movement of the second member relative to the first member, when assembled. To effect a floating engagement or relative vertical movement between the first and second members, a spring 40, under tension, may be provided within slot 34, where the tension, of a predetermined degree, is urging the respective members away from one another.

To counteract this tension, and to take advantage of the construction of this connector, a flexible film 42 of a fixed length is wrapped about and secured to the second or upper member by a plurality of pins 44, only one of which is illustrated in FIG. 2. In addition to the overlying flexible film, it was discovered that since the canted coil spring 26 applies pressure to the back of the flexible film circuit at points incrementally spaced according to the spring winding pitch and frequently not coincident with the pad or trace center, neither the force available nor the force application points are optimum to deflect a pad or trace which is out of contact due to the surface imperfection in its vicinity. Accordingly, as illustrated in FIG. 3, a force integrator 48 was developed consisting of a metal shim 50, such as sheet steel having a thickness of about 0.003 inches, on a relatively soft elastomer 52, where said force integrator 48 is interposed between and co-extensive with the coil springs 26 and flexible film 42.

While the force integrator 48 represented a first step toward improving the performance of electrical connectors utilizing flexible film circuits, there remained the problem of local compliance. More particularly, due to the combination of copper and dielectric layer thicknesses, the local compliance between two adjacent pads in the direction normal to the flexed surface is inadequate to compensate for even relatively small differences in height or otherwise induced variation of the combination of a printed circuit and the flex coplanarity. The practice for developing this combination of copper layers and dielectric will now be described with reference to the sequence of Figures beginning with FIG. 5, while the proposed solution for improved local compliance is illustrated in FIG. 11.

Figure 7:
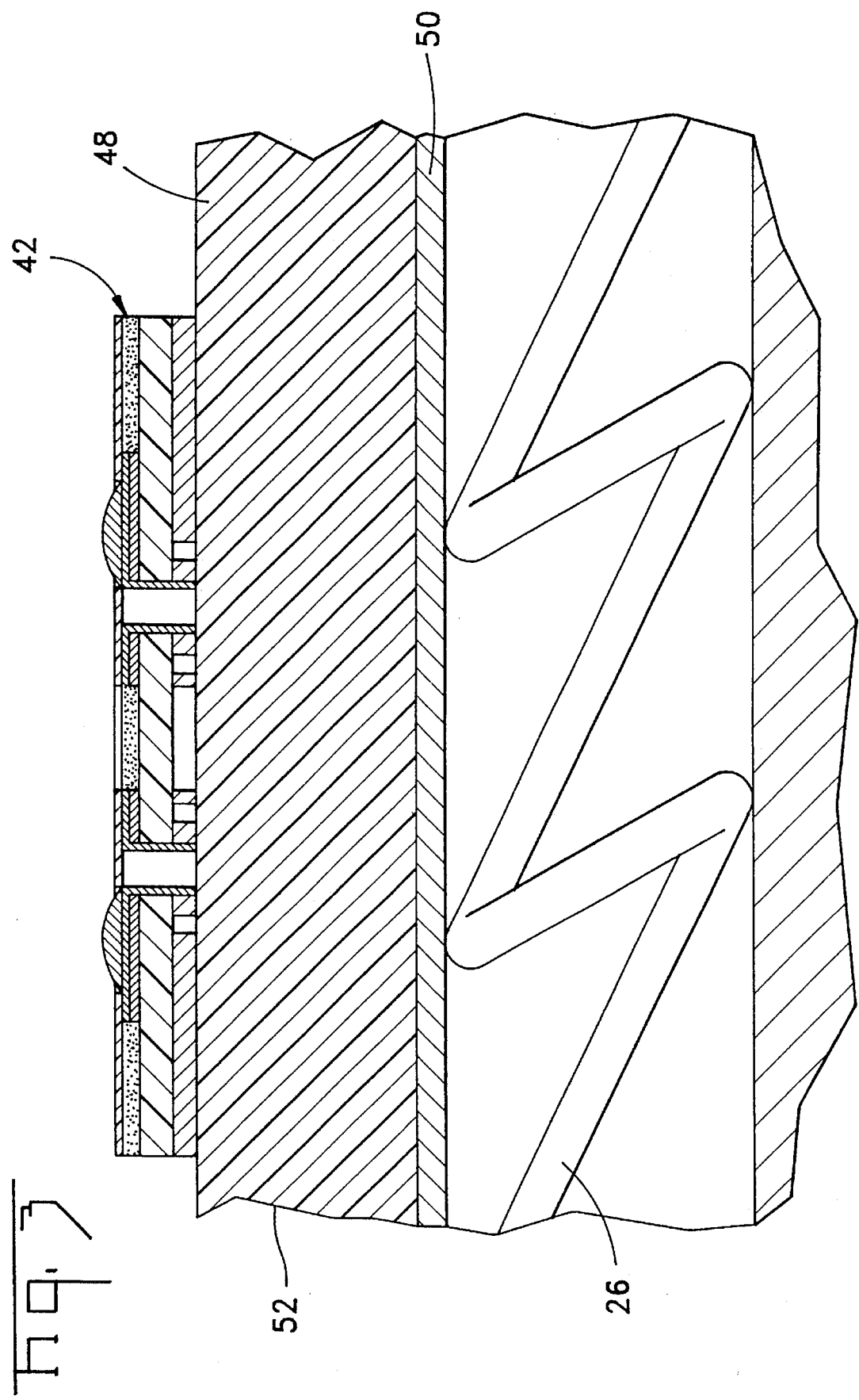

The initial product of FIG. 5 comprises a dielectric intermediate layer 60, such as KAPTON having a thickness of about 0.002 inches, an upper layer 62 of copper, the thickness of which is defined as known in the art as ½ oz., and a thicker lower layer 64 of 1 oz. copper. Thereafter (FIG. 6), a series of selected through holes 66 are provided in the composite film, followed by a further copper plating 67 of the respective surfaces and through holes (FIG. 7).

FIGS. 8 and 10 illustrate the details of developing the circuit pattern, and the pads or traces, for electrically interconnecting the flexible film circuit to a complementary device. As a pattern developing step, the upper layer 62, now two layers of copper, is selectively etched down to the dielectric layer 60, FIG. 8. A prepunched dielectric cover sheet 68 is laminated to the upper layers 62, 67, such as by adhesive 70, where the preselected pattern of prepunched holes 72 overlie the upper most layer 67 adjacent the plated through holes (FIG. 9). To prepare the flexible film for suitable electrical engagement, pads, bumps or traces 74 are plated within the holes 72 so as to extend above the composite surface. For a final plating operation, though not illustrated, the copper pads 74 are nickel plated, then given a final layer of gold.

Figure 4:
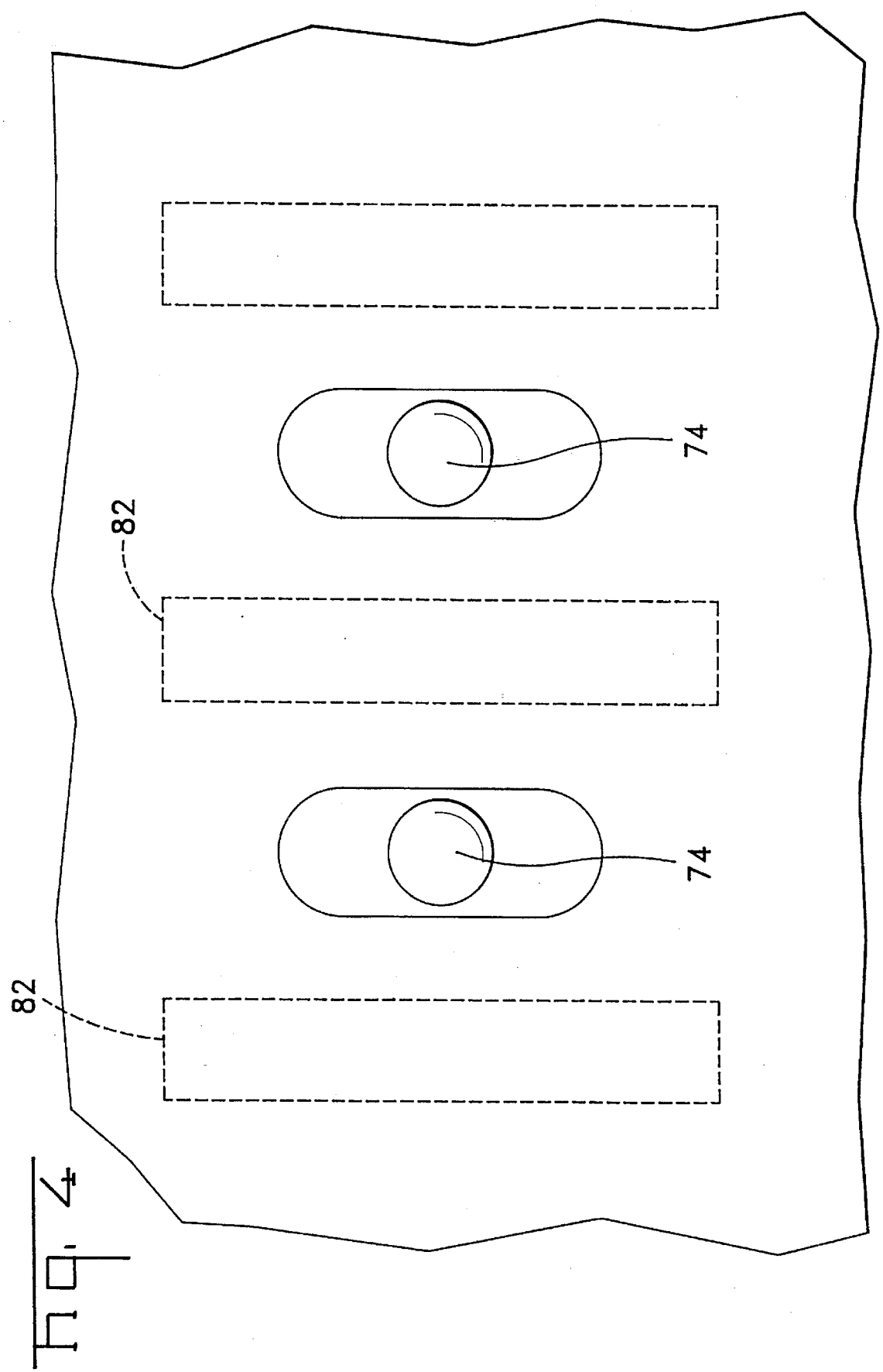
FIG. 4 is an enlarged view of the flexible film with circuit pads or traces illustrating the manner by which local compliance between adjacent circuit pads or traces is achieved.

A final step, best illustrated in the enlarged views FIGS. 11 and 4, is the imaging and etching of the ground plane or copper or lower layer 64. By this step, the plated through holes 72 are provided with etched channels or continuous rings 80 to isolate same from the lower copper layer 64 to separate the signal pads from the ground plane. Additionally, plural slots 82 of a discrete length are etched or otherwise provided in the lower copper layer 64, where such slots 82 are aligned between adjacent pads 74. The slots 82 may be through the material thickness, or partially through the material thickness, in order to allow adjacent pads 74 to move either independently or compliantly to each other, by virtue of local displacement induced by the elastomer. The slitting has an additional advantage, since it allows the pad or contact on the surface of the flexible film circuit to rotate and deflect in a manner that would optimize the probability of some part of the pad 74 making contact with the circuit board, even if a separating particle is interposed between them at some point. Slots may be produced by means of laser cutting, etching and by mechanical punching, the latter being more economically attractive. However, etching has significant advantages also. Since the copper layer 64 is the most rigid component of the flexible film circuit, a significant improvement in compliance between two adjacent pads 74 in the direction normal to its surface can be achieved more economically than by stamping the slots. Since the etching of the signal isolation rings 80 in the ground plane is a necessary step anyway, the slots 82 being etched simultaneously, as an economically feasible added step.

We claim:

1. In an electrical connector of the type utilizing a supported flexible film composite for electrically interconnecting with a planar electronic device, where a normal force must be applied to said film composite in contact with said planar electronic device, the improvement comprising in combination therewith the provision of said normal force being applied by an elastomeric member adjacent a first surface of said flexible film composite, a thin metal shim along a surface of said elastomeric member opposite from said first surface, and a force applying member acting against said metal shim to urge said composite against said planar electronic device.

2. An electrical connector as recited in claim 1 wherein said composite comprises a thin, flexible, dielectric film having upper and lower surfaces, a thin layer of metal disposed along said lower surface, and a plurality of discrete metallic pads or traces along the upper surface, said thin metal layer having plural through slots, where each slot is aligned between a pair of adjacent metallic pads or traces, whereby said composite has improved local compliance between adjacent metallic pads or traces.

3. An electrical connector as recited in claim 2 wherein said composite includes plural through holes to electrically connect said pads or traces to said thin metal layer, and said thin metal layer further includes a through channel about each of said plated through holes to electrically isolate said pads or traces from the balance of said thin metal layer.

4. The electrical connector of claim 2 wherein said slots extend through said composite.

5. The electrical connector of claim 2 wherein said pads or traces are copper over plated with gold and nickel, and said pads or traces extend above the surface of said composite.

6. The electrical connector of claim 2 wherein said pads or traces are generally circular in configuration, with a predetermined diameter, and that the length of said slots is at least twice said predetermined diameter.

7. An electrical connector for connection to a circuit board comprising:

two housings facing each other and forming a space therebetween, each housing having upper and lower halves which are biased apart from each other, each lower half having a groove extending therealong;

a spring member disposed in said groove;

a multilayered force integrator disposed over said spring member, and;

a flexible film composite disposed over said force integrator and around said housing halves of each housing, said composite having conductive layers and pads for electrical connection to traces on the circuit board.

8. An electrical connector as recited in claim 1 wherein said force integrator comprises:

a rigid shim disposed along and in contact with said spring member; and an elastomeric member disposed on a surface of said rigid shim opposite said spring member.

9. An electrical connector as recited in claim 8 wherein said composite comprises a thin, flexible, dielectric film having upper and lower surfaces, a thin layer of metal disposed along said lower surface, and a plurality of discrete metallic pads or traces along the upper surface, said thin metal layer having plural through slots, where each slot is aligned between a pair of adjacent metallic pads or traces, whereby said composite has improved local compliance between adjacent metallic pads or traces.

10. An electrical connector as recited in claim 9 wherein said composite includes plural through holes to electrically connect said pads or traces to said thin metal layer, and said thin metal layer further includes a through channel about each of said plated through holes to electrically isolate said pads or traces from the balance of said thin metal layer.

11. The electrical connector of claim 9 wherein said slots extend through said composite.

12. The electrical connector of claim 9 wherein said pads or traces are copper over plated with gold and nickel, and said pads or traces extend above the surface of said composite.

13. The electrical connector of claim 9 wherein said pads or traces are generally circular in configuration, with a predetermined diameter, and that the length of said slots is at least twice said predetermined diameter.

* * * * *